United States Patent
Tanabe

(10) Patent No.: US 9,013,255 B2
(45) Date of Patent: Apr. 21, 2015

(54) METHOD FOR ADJUSTING MRI SUPERCONDUCTING MAGNET

(75) Inventor: Hajime Tanabe, Chiyoda-ku (JP)

(73) Assignee: Mitsubishi Electric Corporation, Chiyoda-Ku, Tokyo (JP)

(*) Notice: Subject to any disclaimer, the term of this patent is extended or adjusted under 35 U.S.C. 154(b) by 975 days.

(21) Appl. No.: 13/091,633

(22) Filed: Apr. 21, 2011

(65) Prior Publication Data

US 2012/0124798 A1 May 24, 2012

(30) Foreign Application Priority Data

Nov. 24, 2010 (JP) ................. 2010-261286

(51) Int. Cl.
*H01F 1/00* (2006.01)
*H01F 6/00* (2006.01)
*G01R 33/3873* (2006.01)
*G01R 33/38* (2006.01)

(52) U.S. Cl.
CPC ........ *G01R 33/3873* (2013.01); *G01R 33/3802* (2013.01)

(58) Field of Classification Search
USPC ................. 335/216, 296–306; 324/300–322
See application file for complete search history.

(56) References Cited

U.S. PATENT DOCUMENTS

| 4,803,433 A * | 2/1989 | McBride .............. 324/318 |
| 5,168,231 A | 12/1992 | Aubert |
| 5,592,090 A * | 1/1997 | Pissanetzky ............ 324/369 |
| 2004/0017196 A1 | 1/2004 | Huang et al. |
| 2008/0191698 A1 | 8/2008 | Nogami |
| 2008/0194941 A1 | 8/2008 | Steinmeyer et al. |
| 2009/0096453 A1 | 4/2009 | Barnes et al. |
| 2010/0207630 A1 | 8/2010 | Barnes et al. |
| 2011/0298459 A1* | 12/2011 | Adachi et al. ............ 324/318 |
| 2012/0066895 A1 | 3/2012 | Tsuda |
| 2012/0098538 A1* | 4/2012 | Shen et al. .............. 324/318 |

FOREIGN PATENT DOCUMENTS

| CN | 1480742 A | 3/2004 |
| CN | 2674639 Y | 1/2005 |
| CN | 101246205 A | 8/2008 |
| CN | 101484822 A | 7/2009 |

(Continued)

OTHER PUBLICATIONS

Office Action (Notice of Ground of Rejection) issued on Jan. 28, 2014, by the Japanese Patent Office in corresponding Japanese Patent Application No. 2010-261286, and an English Translation of the Office Action. (5 pages).

(Continued)

*Primary Examiner* — Bernard Rojas
(74) *Attorney, Agent, or Firm* — Buchanan Ingersoll & Rooney PC

(57) ABSTRACT

A method of the present invention includes: a step of shimming an MRI superconducting magnet in consideration of the magnetic field atmosphere of a use place; a step of generating a rated magnetic field in the MRI superconducting magnet thus shimmed, under an environment in which the magnetic field atmosphere of the use place is realized; and a step of installing the MRI superconducting magnet in the use place after the step of generating the rated magnetic field. This reduces possibility of occurrence of quench and improves stability in the MRI superconducting magnet.

2 Claims, 11 Drawing Sheets

(56) References Cited

FOREIGN PATENT DOCUMENTS

| | | | |
|---|---|---|---|
| JP | 2-083904 A | 3/1990 | |
| JP | 3-501342 A | 3/1991 | |
| JP | 2006-324411 A | 11/2006 | |
| JP | 2008-220923 A | 9/2008 | |
| JP | 2010-88629 A | 4/2010 | |
| WO | 2010/143603 A1 | 12/2010 | |

OTHER PUBLICATIONS

Chinese Office Action dated Jan. 24, 2014 issued in the corresponding Chinese Patent Application No. 201110204802.0 and English language translation (10 pages).

Chinese Second Office Action dated Sep. 4, 2014 issued in the corresponding Chinese Patent Application No. 201110204802.0 and English language translation (10 pages).

* cited by examiner

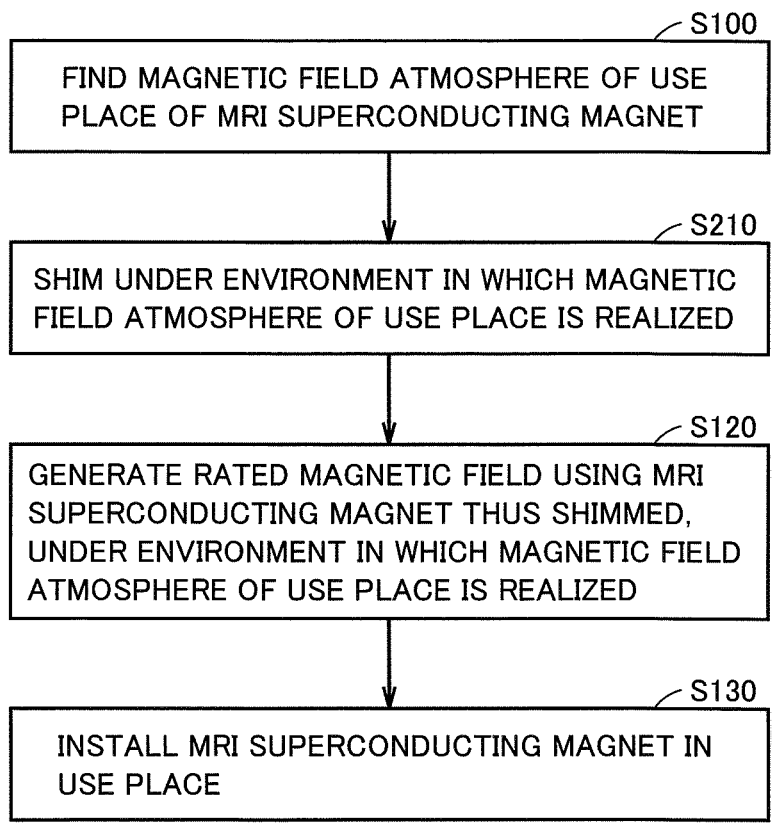

METHOD FOR ADJUSTING MRI SUPERCONDUCTING MAGNET

BACKGROUND OF THE INVENTION

1. Field of the Invention

The present invention relates to a method for adjusting an MRI (magnetic resonance imaging) superconducting magnet.

2. Description of the Background Art

In an MRI superconducting magnet, a static magnetic field in an imaging space is optimized at a design stage so that the uniformity of the static magnetic field in the imaging space will be in an order of ppm (parts per million).

In an actually manufactured MRI superconducting magnet, the uniformity of a static magnetic field is low, specifically, several hundred to several thousand ppm, due to a dimension error of each component and a manufacturing error such as an assembly error. In view of this, shimming is provided as an art of correcting such non-uniformity of static magnetic field.

A prior art document disclosing an MRI apparatus capable of shimming is Japanese Patent Laying-Open No. 2008-220923. In the MRI apparatus described in Japanese Patent Laying-Open No. 2008-220923, the non-uniformity of a static magnetic field is corrected by disposing iron pieces (iron shims) at desired locations.

Such MRI apparatuses improved in the uniformity of a static magnetic field by shimming are brought to and installed in use places such as hospitals. Magnetic field atmospheres in the use places in which the MRI apparatuses are installed differ from one another. Accordingly, the uniformity of the static magnetic field may be compromised by the magnetic field atmosphere in each use place. In view of this, a prior art document, Japanese Patent Laying-Open No. 02-083904, discloses a static magnetic field generating apparatus for reducing the influence of the magnetic field atmosphere in its use place.

In the static magnetic field generating apparatus described in Japanese Patent Laying-Open No. 02-083904, a magnetic plate is provided between a floor on which the MRI apparatus is installed and the MRI apparatus, so as to compensate the uniformity of the magnetic field. The influence on the static magnetic field mainly results from magnetic materials buried in the floor, such as iron bars and iron frames. In the MRI apparatus described in Japanese Patent Laying-Open No. 02-083904, the above-described magnetic plate is determined as an essential component for the MRI apparatus by factory default settings, thereby reducing the influence of the environment under the floor of the use place for the static magnetic field.

By disposing such a magnetic plate for compensating the uniformity of the magnetic field and magnetic members for shimming such as iron pieces in order to improve the uniformity of the static magnetic field in the MRI apparatus at the use place, electromagnetic force generated by an interaction between the magnetic plate and each of magnetic members is exerted on its MRI superconducting magnet.

Such an MRI superconducting magnet is capable of generating a strong and stable static magnetic field by maintaining a superconducting state. However, if an unacceptable amount of disturbance takes place in the superconducting magnet due to the influence of the above-described electromagnetic force, quench, a phenomenon of destroying the superconducting state, will be caused.

An MRI superconducting magnet is less likely to cause quench again in a condition in which it has caused quench once, i.e., exhibits a so-called "training phenomenon". Conversely, when an MRI superconducting magnet is operated in a condition in which it has not been operated before, quench is highly likely to take place.

SUMMARY OF THE INVENTION

It is an object of the present invention to provide a method for adjusting an MRI superconducting magnet, so as to achieve improved stability in the MRI superconducting magnet by reducing possibility of occurrence of quench.

A method according to the present invention for adjusting an MRI superconducting magnet is a method for adjusting an MRI superconducting magnet before installation thereof in a use place. The method for adjusting the MRI superconducting magnet includes the steps of: shimming the MRI superconducting magnet in consideration of a magnetic field atmosphere of the use place; generating a rated magnetic field in the MRI superconducting magnet thus shimmed, under an environment in which the magnetic field atmosphere of the use place is realized; and installing the MRI superconducting magnet in the use place after the step of generating the rated magnetic field.

According to the present invention, possibility of occurrence of quench can be reduced to improve stability in the MRI superconducting magnet.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a flowchart showing a method for adjusting the MRI superconducting magnet of a second embodiment of the present invention.

DESCRIPTION OF THE PREFERRED EMBODIMENTS

Figure 1:
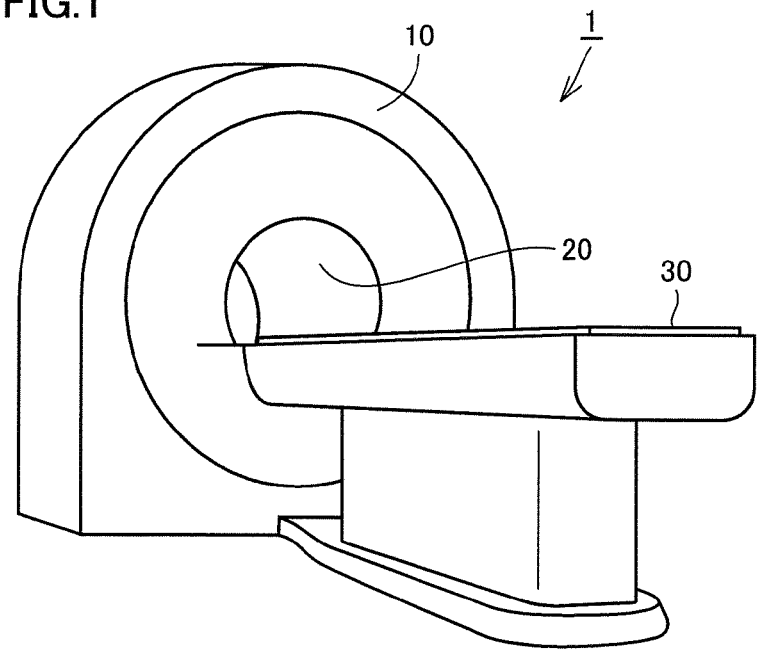
FIG. 1 is a perspective view showing an external appearance of an MRI apparatus.

The following describes a method for adjusting an MRI superconducting magnet in a first embodiment of the present invention, with reference to figures. In the below-mentioned description of the embodiments, the same or corresponding portions are given the same reference characters and are not described repeatedly.

First Embodiment

FIG. 1 is a perspective view showing an external appearance of the MRI apparatus. As shown in FIG. 1, MRI apparatus 1 includes a static magnetic field generating unit 10 and a bed 30. Static magnetic field generating unit 10 includes a below-described MRI superconducting magnet, and generates a static magnetic field in a bore 20.

Figure 2:
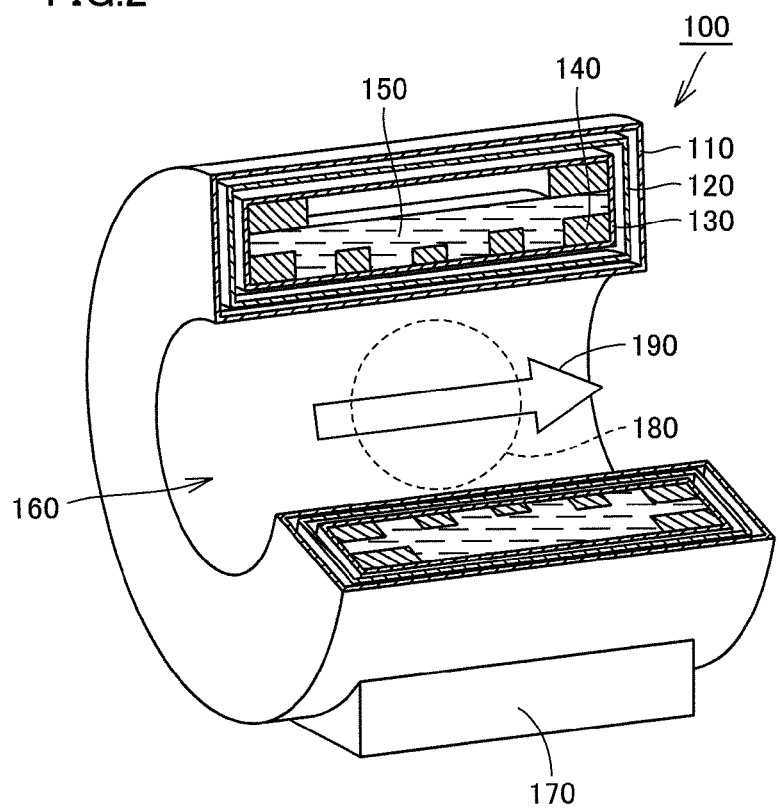
FIG. 2 is a cross sectional view of a structure of an MRI superconducting magnet in a first embodiment of the present invention.

FIG. 2 is a cross sectional view showing a structure of the MRI superconducting magnet in the first embodiment of the present invention. As shown in FIG. 2, a vacuum cell 110 having a hollow cylindrical shape is disposed at the outermost side in MRI superconducting magnet 100 of the first embodiment of the present invention. A space at the center of the cylindrical portion of vacuum cell 110 serves as a bore portion 160 corresponding to bore 20. Pressure in vacuum cell 110 is reduced to be vacuum by a decompression device not shown in the figure. Vacuum cell 110 is supported by a leg 170 disposed below vacuum cell 110, so as to allow the central axis of bore portion 160 to extend in the horizontal direction.

In vacuum cell 110, a heat shield 120 is disposed which has a hollow cylindrical shape substantially analogue to that of vacuum cell 110. In heat shield 120, a helium cell 130 is disposed which has a hollow cylindrical shape substantially analogue to that of heat shield 120. Heat shield 120 has a function of providing thermal insulation between helium cell 130 and vacuum cell 110.

In helium cell 130, superconducting coils 140 are disposed circumferentially. Helium cell 130 is filled with liquid helium 150. Superconducting coils 140 is immersed in liquid helium 150 and is cooled.

When MRI superconducting magnet 100 becomes operational, a static magnetic field 190 is generated in the direction of an arrow in the figure in bore portion 160 at a static magnetic field region 180 indicated by a dotted line. It is desired that this static magnetic field 190 is strong, uniform, and stable.

Figure 3:
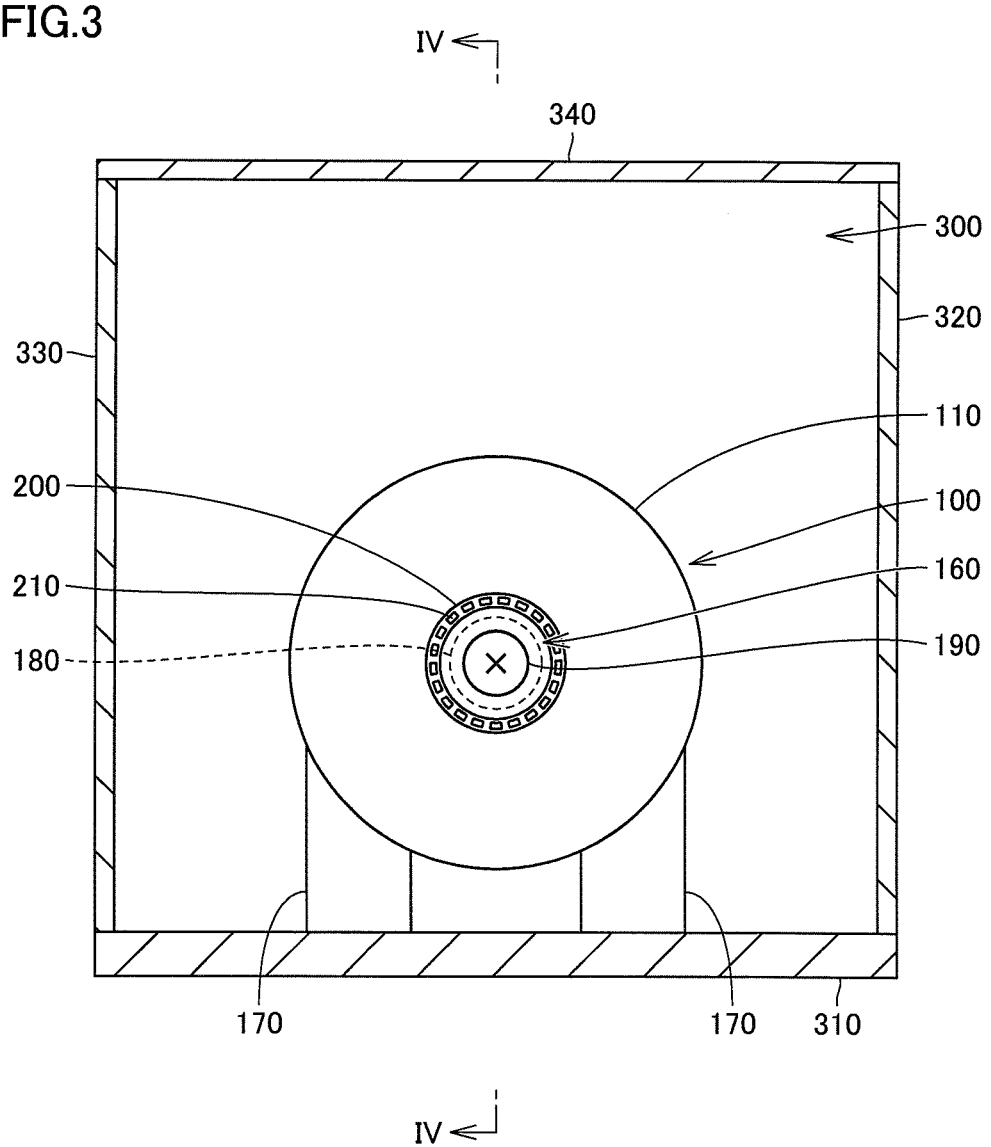
FIG. 3 is a side view showing that the MRI superconducting magnet of the embodiment is installed in a use place.
Figure 4:
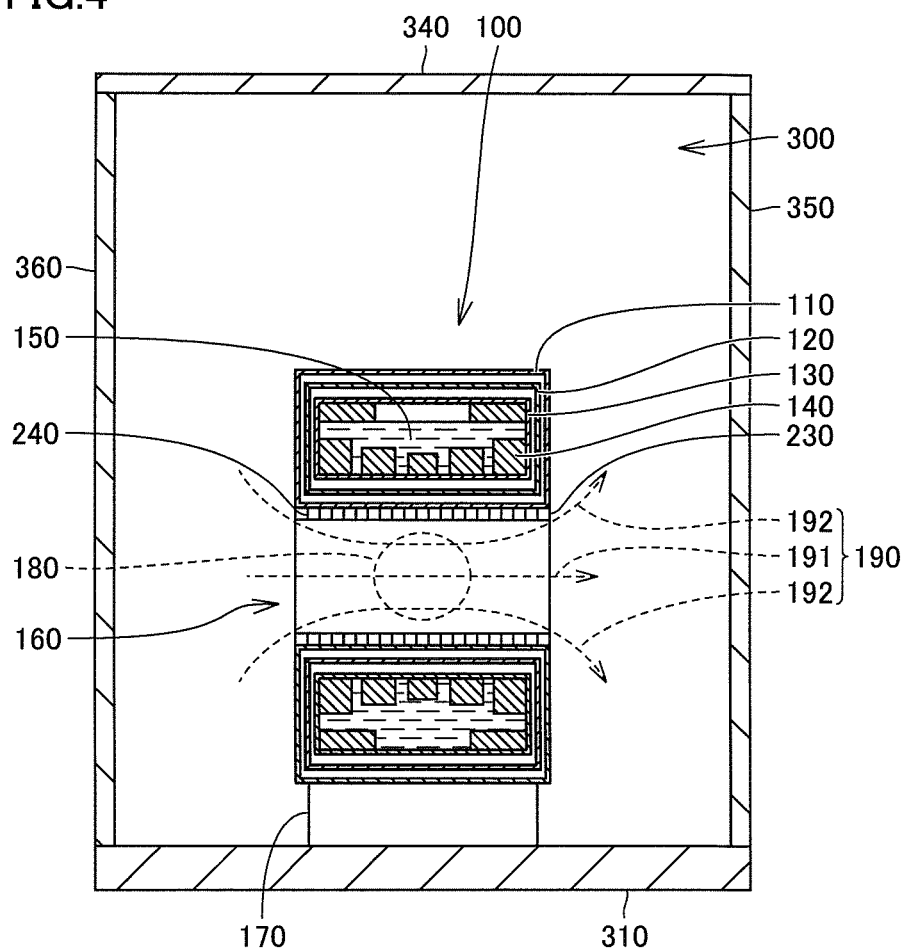
FIG. 4 is a diagram when viewed in a direction of an arrow of line IV-IV in FIG. 3.

FIG. 3 is a side view showing a state in which the MRI superconducting magnet of the present embodiment is installed in a use place. FIG. 4 shows the MRI superconducting magnet viewed in the direction of an arrow of a line IV-IV in FIG. 3.

As shown in FIGS. 3, 4, MRI superconducting magnet 100 of the present embodiment is installed in a room 300, which is the use place. In the present embodiment, room 300 is covered with magnetic shields in order to reduce leakage of a magnetic field generated by MRI superconducting magnet 100, from room 300.

The magnetic shields include: a floor shield 310 disposed on a floor portion; a first side wall shield 320 disposed at a side wall portion on the right side of FIG. 3; a second side wall shield 330 disposed at a side wall portion on the left side of FIG. 3; a third side wall shield 350 disposed at a side wall portion on the right side of FIG. 4; a fourth side wall shield 360 disposed at a side wall portion on the left side of FIG. 4; and a ceiling shield 340 at a ceiling portion. In the present embodiment, each of the magnetic shields is formed of an iron plate, but the material of the magnetic shield is not particularly limited as long as it is formed of a magnetic member.

Because floor shield 310 is located close to MRI superconducting magnet 100 and supports the weight of MRI superconducting magnet 100, floor shield 310 is formed to be thicker than first side wall shield 320, second side wall shield 330, third side wall shield 350, fourth side wall shield 360, and ceiling shield 340.

Although illustrated in a simplified manner in FIG. 2, as shown in FIG. 4, static magnetic field 190 includes a central magnetic field 191 generated on the central axis of bore portion 160, and edge-side magnetic fields 192 generated at the radial edge portions of bore portion 160. Each of edge-side magnetic fields 192 generated is in the form of a straight line in static magnetic field region 180, and is in the form of a curve at each of the edge portions of bore portion 160 in the central axis direction thereof.

Figure 5:
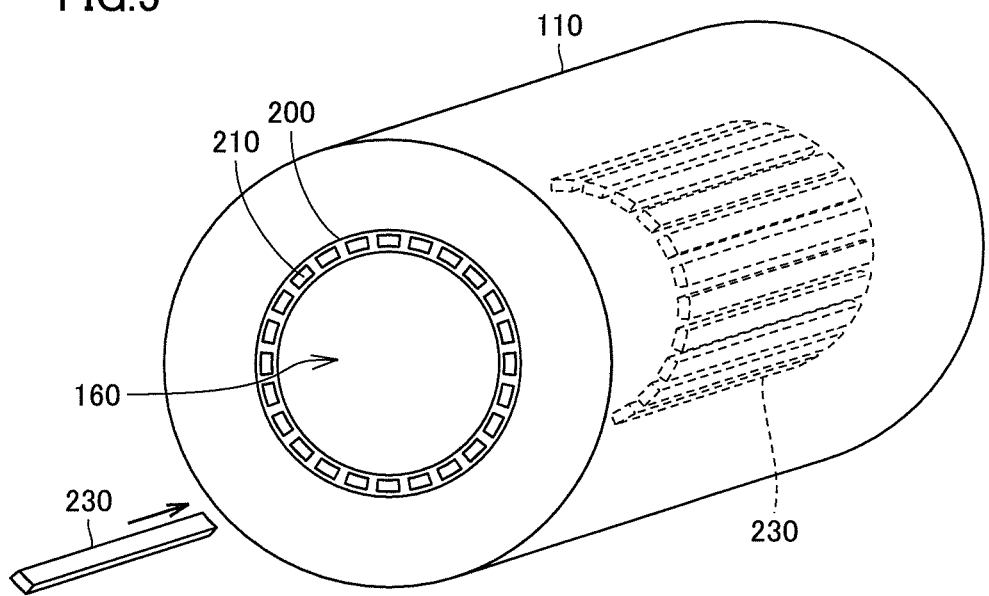
FIG. 5 is a perspective view showing a shimming portion in the MRI superconducting magnet of the embodiment.
Figure 6:
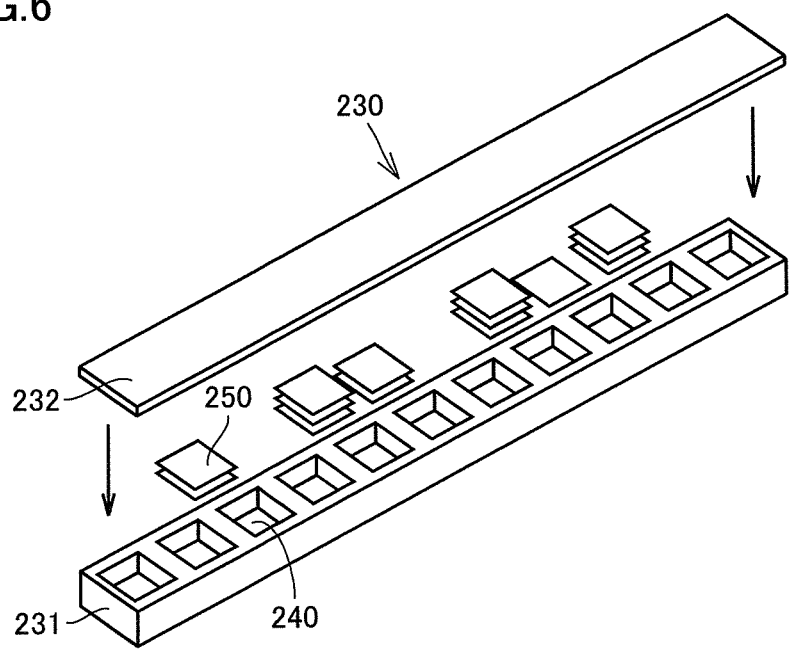
FIG. 6 is an exploded perspective view showing a shim tray and iron pieces in the embodiment.

FIG. 5 is a perspective view showing a shimming portion in the MRI superconducting magnet of the present embodiment. FIG. 6 is an exploded perspective view showing a shim tray and iron pieces of the present embodiment.

Although not shown in FIG. 2, MRI superconducting magnet 100 has a shimming portion 200 formed to extend along the inner circumferential side wall of vacuum cell 110, as shown in FIGS. 3, 5. In shimming portion 200, a plurality of openings 210 are provided with spaces therebetween in the circumferential direction of shimming portion 200, and extend in the central axis direction of bore portion 160.

As shown in FIGS. 4, 5, and 6, a shim tray 230 is inserted into each of openings 210. As shown in FIG. 6, shim tray 230 includes a main body 231 and a cover 232. Main body 231 is provided with recesses 240 for accommodating therein a plurality of iron pieces 250 each constituted by a thin plate with a rectangular shape.

By adjusting the number of iron pieces 250 accommodated in each of the plurality of recesses 240 of the plurality of shim trays 230 to be respectively inserted into openings 210, the uniformity of static magnetic field 190 can be improved in static magnetic field region 180. As such, the shimming is to improve the uniformity of static magnetic field 190 in static magnetic field region 180 by disposing iron pieces 250 in this way.

Here, the following describes electromagnetic force acting on MRI superconducting magnet 100 when generating a rated magnetic field by means of MRI superconducting magnet 100. It should be noted that FIGS. 7 to 12 only show the magnetic shields with regard to the room in which MRI superconducting magnet 100 is installed. It should be also noted that the term "rated magnetic field" refers to a magnetic field having a strength required in imaging with the use of MRI superconducting magnet 100.

Figure 7:
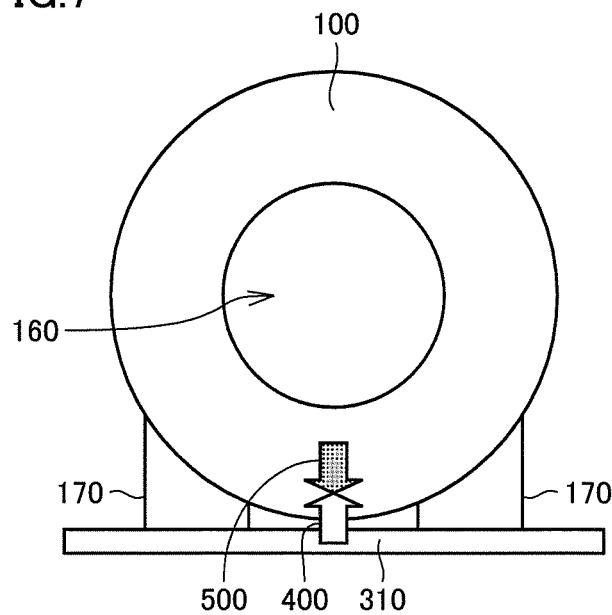
FIG. 7 schematically shows electromagnetic force upon generating a rated magnetic field with floor shields being disposed obliquely below the MRI superconducting magnet.

FIG. 7 schematically shows electromagnetic force upon generating the rated magnetic field with the floor shield being disposed below the MRI superconducting magnet. As shown in FIG. 7, when generating the rated magnetic field in MRI superconducting magnet 100 with floor shield 310 being disposed therebelow, attracting force 400 is exerted on floor shield 310 to attract it to MRI superconducting magnet 100.

As a result, electromagnetic force 500 is exerted in MRI superconducting magnet 100 as reaction force for attracting force 400. Attracting force 400 and electromagnetic force 500 are opposite in direction and the same in strength.

Figure 8:
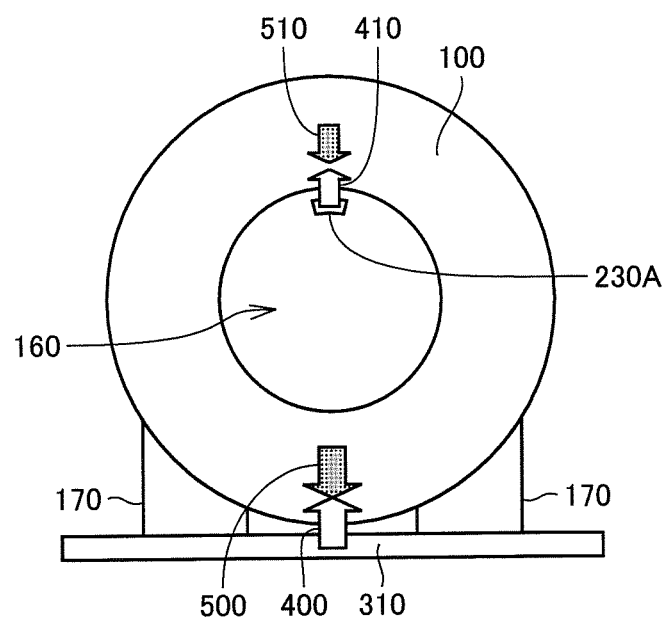
FIG. 8 schematically shows electromagnetic forces upon generating the rated magnetic field with the MRI superconducting magnet of FIG. 7 being shimmed.

FIG. 8 schematically shows electromagnetic forces upon generating the rated magnetic field with the MRI superconducting magnet of FIG. 7 being shimmed. As shown in FIG. 8, in order to reduce the influence of electromagnetic force 500 over static magnetic field 190, a shim tray 230A accommodating iron pieces 250 therein is inserted into an opening 210 at an upper location in bore portion 160. In this state, when the rated magnetic field is generated in MRI superconducting magnet 100, attracting force 410 is exerted on iron pieces 250 to attract them to MRI superconducting magnet 100.

As a result, electromagnetic force 510 is exerted in MRI superconducting magnet 100 as reaction force for attracting force 410. Attracting force 410 and electromagnetic force 510 are opposite in direction and the same in strength. Accordingly, electromagnetic force 500 and electromagnetic force 510 are exerted in MRI superconducting magnet 100.

Figure 9:
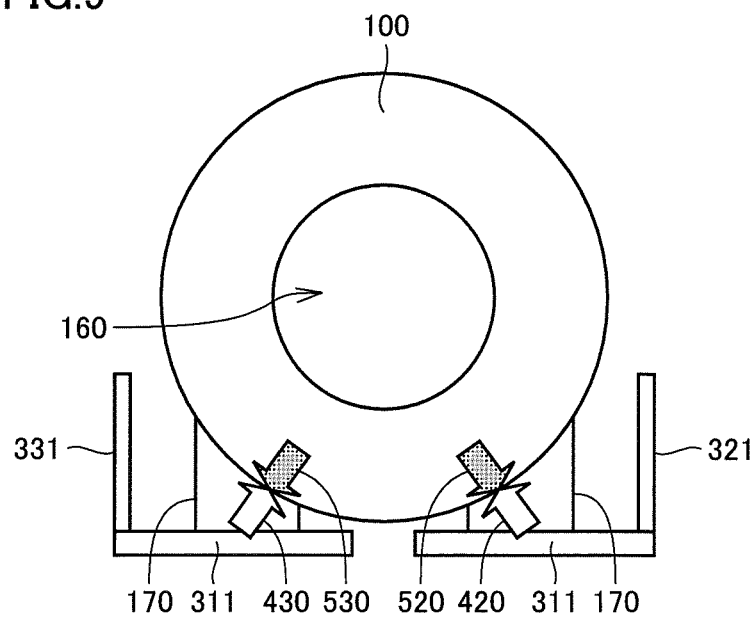
FIG. 9 schematically shows electromagnetic forces upon generating the rated magnetic field with floor shields being disposed obliquely below the MRI superconducting magnet and with side wall shields being disposed at the sides thereof.

FIG. 9 schematically shows electromagnetic forces upon generating the rated magnetic field, with floor shields being disposed obliquely below the MRI superconducting magnet and with side wall shields being disposed at the sides thereof.

As shown in FIG. 9, two floor shields 311 are disposed below the central axis of bore portion 160 with a space therebetween. Further, a side wall shield 321 and a side wall shield 331 are disposed to face each other. Side wall shield 321 and side wall shield 331 have the same size and the same thickness.

When generating the rated magnetic field in MRI superconducting magnet 100 with floor shield 311 and side wall shields 321, 331 being thus disposed, attracting force 420 is exerted on floor shield 311 and side wall shield 321 at the right side of the figure, so as to attract them to MRI superconducting magnet 100. In particular, attracting force 420 is exerted obliquely, i.e., upward and leftward on floor shield 311, which is located near MRI superconducting magnet 100.

Likewise, attracting force 430 is exerted on floor shield 311 and side wall shield 331 at the left side of the figure, so as to attract them to MRI superconducting magnet 100. In particular, attracting force 430 is exerted obliquely, i.e., upward and rightward on floor shield 311, which is located near MRI superconducting magnet 100.

As a result, electromagnetic force 520 is exerted in MRI superconducting magnet 100 as reaction force for attracting force 420. Attracting force 420 and electromagnetic force 520 are opposite in direction and the same in strength. Further, electromagnetic force 530 is exerted in MRI superconducting magnet 100 as reaction force for attracting force 430. Attracting force 430 and electromagnetic force 530 are opposite in direction and the same in strength. Accordingly, electromagnetic force 520 and electromagnetic force 530 are exerted in MRI superconducting magnet 100.

Figure 10:
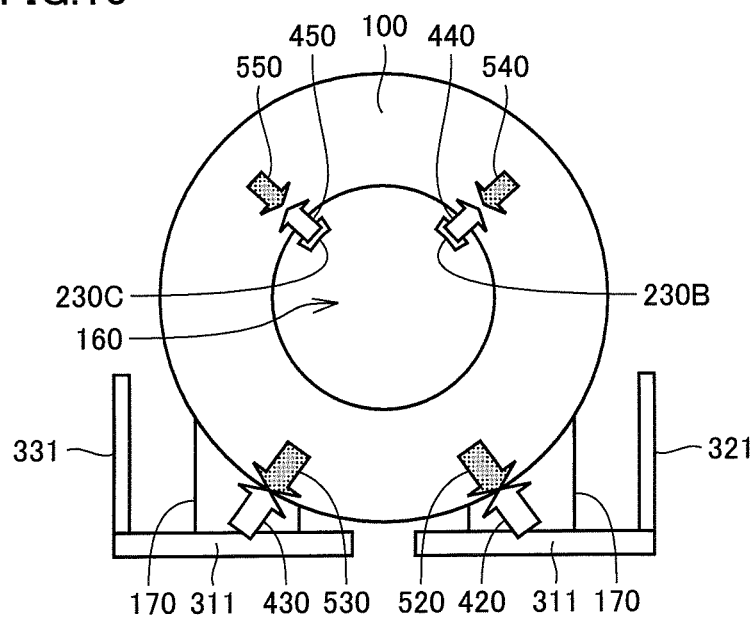
FIG. 10 schematically shows electromagnetic forces upon generating the rated magnetic field with the MRI superconducting magnet of FIG. 9 being shimmed.

FIG. 10 schematically shows electromagnetic forces upon generating the rated magnetic field with the MRI superconducting magnet of FIG. 9 being shimmed. As shown in FIG. 10, in order to reduce the influence of electromagnetic force 530 over static magnetic field 190, a shim tray 230B accommodating iron pieces 250 therein is inserted into an opening 210 at an upper right location in bore portion 160. In this state, when the rated magnetic field is generated in MRI superconducting magnet 100, attracting force 440 is exerted on iron pieces 250 to attract them to MRI superconducting magnet 100.

Similarly, in order to reduce the influence of electromagnetic force 520 over static magnetic field 190, a shim tray 230C accommodating iron pieces 250 therein is inserted into an opening 210 at an upper left location in bore portion 160. In this state, when the rated magnetic field is generated in MRI superconducting magnet 100, attracting force 450 is exerted on iron pieces 250 to attract them to MRI superconducting magnet 100.

As a result, electromagnetic force 540 is exerted in MRI superconducting magnet 100 as reaction force for attracting force 440. Attracting force 440 and electromagnetic force 540 are opposite in direction and the same in strength. Similarly, electromagnetic force 550 is exerted in MRI superconducting magnet 100 as reaction force for attracting force 450. Attracting force 450 and electromagnetic force 550 are opposite in direction and the same in strength. Accordingly, electromagnetic force 520, electromagnetic force 530, electromagnetic force 540, and electromagnetic force 550 are exerted in MRI superconducting magnet 100.

Figure 11:
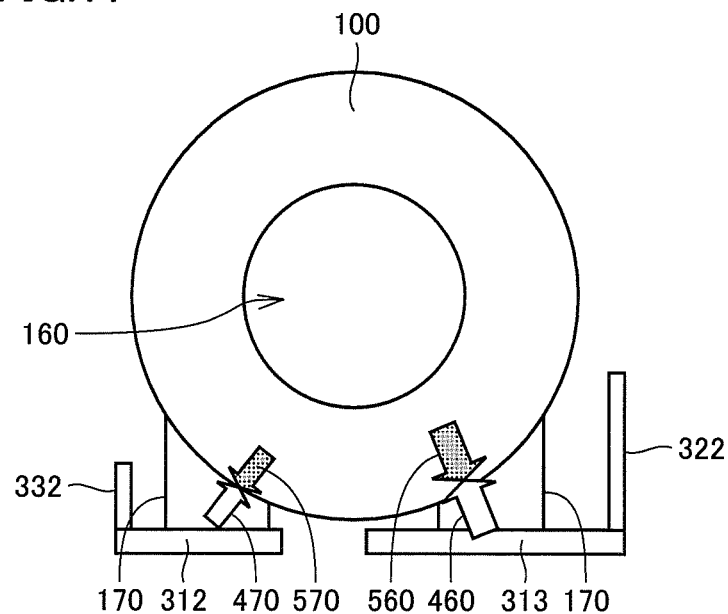
FIG. 11 schematically shows electromagnetic forces upon generating the rated magnetic field with floor shields different in size being disposed obliquely below the MRI superconducting magnet and with side wall shields different in size being disposed at the sides thereof.

FIG. 11 schematically shows electromagnetic forces upon generating the rated magnetic field with floor shields different in size being disposed obliquely below the MRI superconducting magnet and with side wall shields different in size being disposed at the sides thereof.

As shown in FIG. 11, floor shield 312 and floor shield 313 are disposed below the central axis of bore portion 160 with a space therebetween. Floor shield 312 and floor shield 313 have the same thickness, but floor shield 312 is larger than floor shield 313.

Further, a side wall shield 322 and a side wall shield 332 are disposed to face each other. Side wall shield 322 and side wall shield 332 have the same thickness, but side wall shield 322 is larger than side wall shield 332. As such, the magnetic shields may be disposed in the asymmetrical manner around MRI superconducting magnet 100. It should be noted that the magnetic shields shown in FIG. 11 are only exemplary, and there may be various thicknesses and arrangements for the magnetic shields.

When generating the rated magnetic field in MRI superconducting magnet 100 with floor shields 312, 313 and side wall shields 322, 332 being thus disposed, attracting force 460 is exerted on floor shield 313 and side wall shield 322, so as to attract them to MRI superconducting magnet 100. In particular, attracting force 460 is exerted obliquely, i.e., upward and leftward on floor shield 313, which is located near MRI superconducting magnet 100.

Likewise, attracting force 470 is exerted on floor shield 312 and side wall shield 332 so as to attract them to MRI superconducting magnet 100. In particular, attracting force 470 is exerted obliquely, i.e., upward and rightward on floor shield 312, which is located near MRI superconducting magnet 100.

As a result, electromagnetic force 560 is exerted in MRI superconducting magnet 100 as reaction force for attracting force 460. Attracting force 460 and electromagnetic force 560 are opposite in direction and the same in strength. Further, electromagnetic force 570 is exerted in MRI superconducting magnet 100 as reaction force for attracting force 470. Attracting force 470 and electromagnetic force 570 are opposite in direction and the same in strength. Accordingly, electromagnetic force 560 and electromagnetic force 570 are exerted in MRI superconducting magnet 100.

Figure 12:
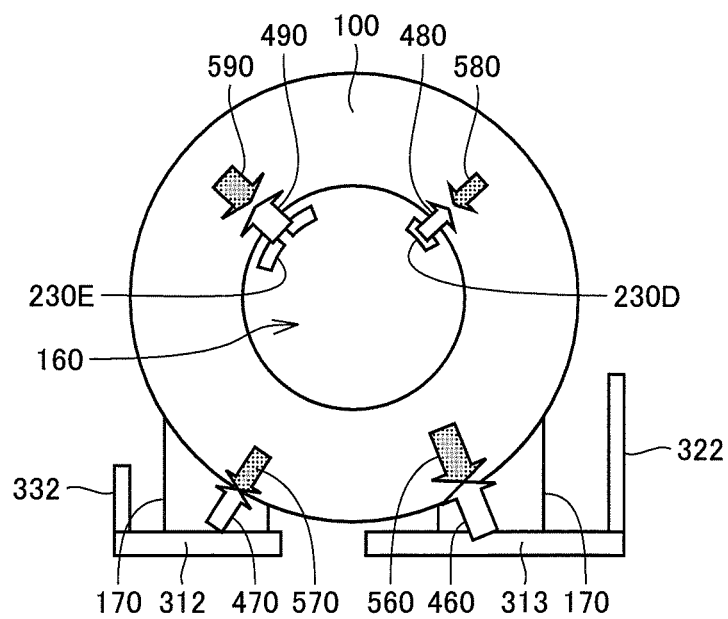
FIG. 12 schematically shows electromagnetic forces upon generating the rated magnetic field with the MRI superconducting magnet of FIG. 11 being shimmed.

FIG. 12 schematically shows electromagnetic forces upon generating the rated magnetic field with the MRI superconducting magnet of FIG. 11 being shimmed. As shown in FIG. 12, in order to reduce the influence of electromagnetic force 570 over static magnetic field 190, a shim tray 230D accommodating iron pieces 250 therein is inserted into an opening 210 at an upper right location in bore portion 160. In this state, when the rated magnetic field is generated in MRI superconducting magnet 100, attracting force 480 is exerted on iron pieces 250 to attract them to MRI superconducting magnet 100.

Likewise, in order to reduce the influence of electromagnetic force 560 over static magnetic field 190, a shim tray 230E accommodating iron pieces 250 therein is inserted into an opening 210 at an upper left location in bore portion 160. In this state, when the rated magnetic field is generated in MRI superconducting magnet 100, attracting force 490 is exerted on iron pieces 250 to attract them to MRI superconducting magnet 100.

As a result, electromagnetic force 580 is exerted in MRI superconducting magnet 100 as reaction force for attracting force 480. Attracting force 480 and electromagnetic force 580 are opposite in direction and the same in strength. Similarly, electromagnetic force 590 is exerted in MRI superconducting magnet 100 as reaction force for attracting force 490. Attracting force 490 and electromagnetic force 590 are opposite in direction and the same in strength. Accordingly, electromagnetic force 560, electromagnetic force 570, electromagnetic force 580, and electromagnetic force 590 are exerted in MRI superconducting magnet 100.

As described above, the electromagnetic forces with various strengths are exerted on MRI superconducting magnet 100 at its various locations due to the influences of the magnetic field atmosphere of the use place and iron pieces 250 disposed for the shimming. When an unacceptable amount of electromagnetic force is exerted on MRI superconducting magnet 100, quench is highly likely to take place. In particular, when the unacceptable amount of electromagnetic force is exerted thereon for the first time, the quench is highly likely to take place. Hence, in MRI superconducting magnet 100 of the present embodiment, the following adjustment is provided before the installation in the use place, so as to reduce the possibility of occurrence of the quench.

Figure 13:
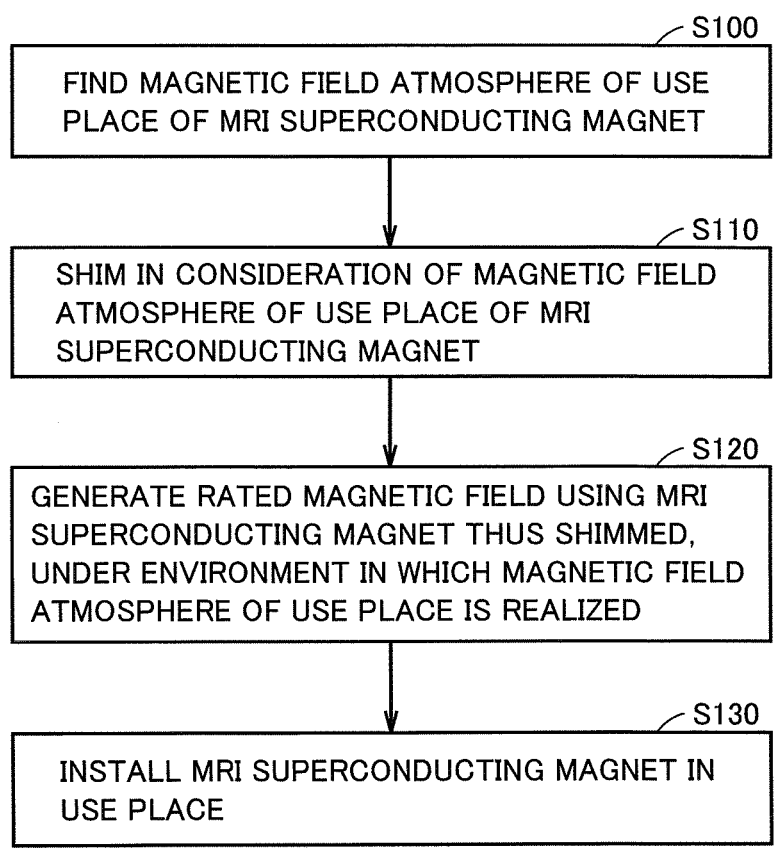
FIG. 13 is a flowchart showing a method for adjusting the MRI superconducting magnet of the embodiment.

The following describes a method for adjusting MRI superconducting magnet 100 of the present embodiment. FIG. 13 is a flowchart showing the method for adjusting the MRI superconducting magnet in the present embodiment.

In the present embodiment, the shimming is performed before the installation to a use place. Specifically, the shimming is performed in a factory for manufacturing MRI superconducting magnet 100. The shimming is performed such that static magnetic field 190 of static magnetic field region 180 will be uniform when MRI superconducting magnet 100 is installed in the use place. To achieve this, it is necessary to perform the shimming in the factory in consideration of the magnetic field atmosphere of the use place in which MRI superconducting magnet 100 is to be installed.

Hence, first, the magnetic field of room 300 in which MRI superconducting magnet 100 is to be installed is measured to find the magnetic field atmosphere in room 300 (S100). Specifically, measured before the shimming of MRI superconducting magnet 100 is a total of the magnetic fields resulting from floor shield 310, first side wall shield 320, second side wall shield 330, third side wall shield 350, fourth side wall shield 360, and ceiling shield 340 of room 300 in which MRI superconducting magnet 100 is to be installed. However, instead of measuring the total of the magnetic fields, the magnetic field atmosphere in room 300 may be found based on a result of magnetic field analysis performed under a condition of standard magnetic shield as well as accumulated past statistical data.

After the measurement of the magnetic field in the use place, the result of measurement of the magnetic field in room 300 and a manufacturing error in the MRI superconducting magnet assembled in the factory are input into a program for the magnetic field analysis, so as to analyze simulation of static magnetic field 190 in static magnetic field region 180.

Based on the analysis of simulation, an arrangement of iron pieces 250 is determined to achieve improved uniformity of static magnetic field 190 in static magnetic field region 180, thereby implementing the shimming of MRI superconducting magnet 100. In other words, the MRI superconducting magnet is shimmed in consideration of the magnetic field atmosphere of the use place (S110).

Next, MRI superconducting magnet 100 thus shimmed is brought into a magnetic field atmosphere substantially the same as the magnetic field atmosphere of room 300 that is the use place. In this state, the rated magnetic field is generated. In other words, in an environment in which the magnetic field atmosphere of the use place is realized, the rated magnetic field is generated using MRI superconducting magnet 100 shimmed (S120).

Figure 14:
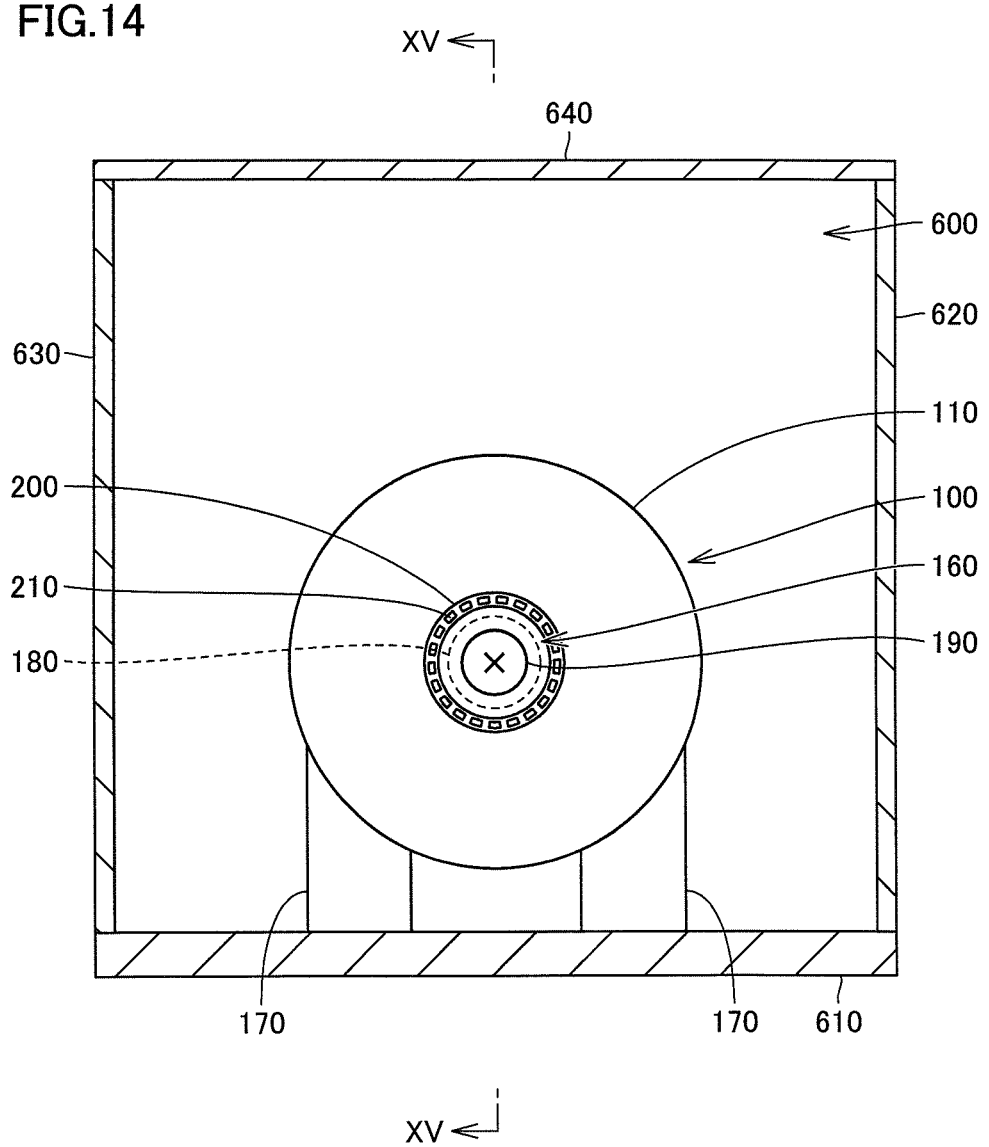
FIG. 14 is a side view showing that a magnetic field atmosphere in a factory for manufacturing the MRI superconducting magnet is adapted to be equivalent to that of the use place.
Figure 15:
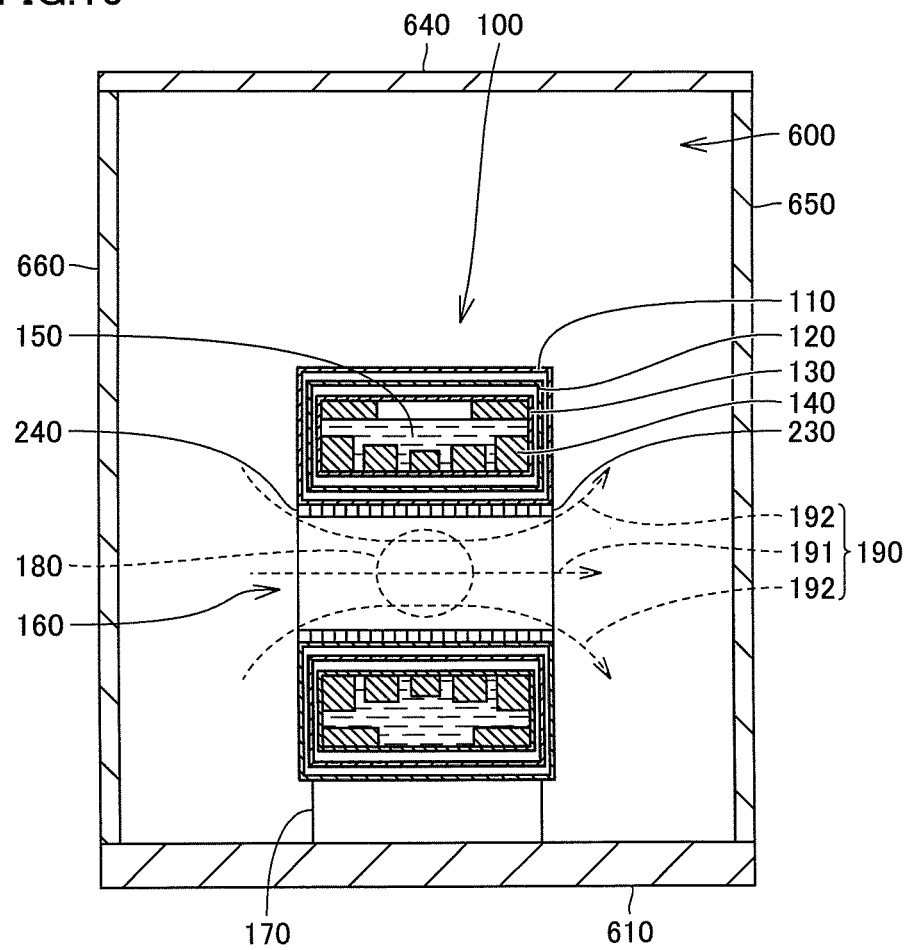
FIG. 15 is a diagram when viewed in a direction of an arrow of line XV-XV in FIG. 14.

FIG. 14 is a side view showing that the magnetic field atmosphere of the factory for manufacturing the MRI superconducting magnet is adapted to be equivalent to the magnetic field atmosphere of the use place. FIG. 15 shows the MRI superconducting magnet when viewed in a direction of line XV-XV of FIG. 14.

As shown in FIGS. 14, 15, the circumference of factory 600 for manufacturing MRI superconducting magnet 100 is covered with magnetic shields each formed of a magnetic member, whereby the magnetic field atmosphere of factory 600 is adapted to be equivalent to the magnetic field atmosphere of room 300, which is the use place.

Specifically, factory 600 is covered with magnetic shields including a floor shield 610 disposed on floor portion, a first side wall shield 620 disposed at a side wall portion on the right side of FIG. 14, a second side wall shield 630 disposed at a side wall portion on the left side of FIG. 14, a third side wall shield 650 disposed at a side wall portion on the right side of FIG. 15, a fourth side wall shield 660 disposed at a side wall portion on the left side of FIG. 15, and a ceiling shield 640 disposed at ceiling portion. In the present embodiment, each of these magnetic shields is constituted by an iron plate, but the material of the magnetic shield is not particularly limited as long as it is formed of a magnetic member.

The magnetic shields thus disposed in factory 600 are configured to form, in factory 600, a magnetic field atmosphere equivalent to the magnetic field atmosphere to be formed by the magnetic shields disposed in room 300.

In the present embodiment, the desired magnetic field atmosphere is formed by covering factory 600 with the magnetic shields, but the method for forming the magnetic field atmosphere is not limited to this and another method may be employed to form such a desired magnetic field atmosphere.

In factory 600 thus having the magnetic field atmosphere equivalent to that of room 300, when the rated magnetic field is generated in MRI superconducting magnet 100, the electromagnetic forces are exerted on the MRI superconducting magnet 100 as described above. The electromagnetic forces are equivalent to the electromagnetic forces supposed to be exerted on MRI superconducting magnet 100 generating the rated magnetic field in the magnetic field atmosphere of room 300, which is the use place.

In MRI superconducting magnet 100, constant electromagnetic forces are generated in the axial direction and the radial direction irrespective of whether or not the external magnetic members are provided. Even if each electromagnetic force does not cause quench, the electromagnetic forces may be overlapped to generate a new disturbance, which may lead to occurrence of quench.

For example, when the electromagnetic forces are exerted on coils constituting superconducting coils 140, an epoxy resin provided between the coils, an interlayer film, or the like, minute cracks may be generated in superconducting coil 140. In this case, quench may take place if heat is generated in superconducting coil 140.

When quench takes place, the operation of MRI superconducting magnet 100 is stopped and it is confirmed whether or not superconducting coils 140 have been cooled. Thereafter, new liquid helium is supplied for replenishment. Then, the rated magnetic field is generated using MRI superconducting magnet 100 again. Also on this occasion, electromagnetic forces similar to electromagnetic forces generated upon initially generating the rated magnetic field are exerted on MRI superconducting magnet 100, but new cracks are less likely to be generated in superconducting coils 140. Hence, conditions of cooling by liquid helium 150 are hardly changed, thus reducing the possibility of occurrence of the quench. The step of generating the rated magnetic field and the step of supplying the liquid helium may be performed until no quench takes place in MRI superconducting magnet 100.

In factory 600, the quench may not be necessarily caused with MRI superconducting magnet 100 through the generation of the rated magnetic field. If MRI superconducting magnet 100 is adapted not to cause quench in factory 600 until the rated magnetic field is generated, quench will be less likely to take place upon utilization of MRI superconducting magnet 100 installed in the use place.

Finally, MRI superconducting magnet 100 is installed in room 300, which is the use place (S130). By thus adjusting MRI superconducting magnet 100 before the installation to the use place, the possibility of occurrence of quench in MRI superconducting magnet 100 at the use place is reduced, thereby achieving improved stability of MRI superconducting magnet 100.

It should be noted that as an operation of implementing the shimming, magnetic members may be disposed in MRI superconducting magnet 100 in a simplified manner, instead of accommodating iron pieces 250 in shim tray 230.

The following describes a method for adjusting an MRI superconducting magnet in a second embodiment of the present invention, with reference to figures.

Second Embodiment

The method for adjusting MRI superconducting magnet 100 in the second embodiment of the present invention is different in the step of shimming, from the method for adjusting MRI superconducting magnet 100 in the first embodiment. Hence, the other steps are not described repeatedly.

FIG. 16 is a flowchart showing the method for adjusting the MRI superconducting magnet in the second embodiment of the present invention. As shown in FIG. 16, in the present embodiment, MRI superconducting magnet 100 is shimmed in an environment in which a magnetic field atmosphere of the use place, i.e., room 300 is realized (S210).

Specifically, as shown in FIGS. 14, 15, MRI superconducting magnet 100 is shimmed in factory 600 having a magnetic field atmosphere equivalent to the magnetic field atmosphere of room 300 that is the use place. In this case, the shimming can be implemented while actually measuring the magnetic field of static magnetic field 190 in static magnetic field region 180, thereby achieving improved uniformity of static magnetic field 190.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for adjusting an MRI superconducting magnet before installation thereof in a use place, comprising the steps of:
    shimming said MRI superconducting magnet in consideration of a magnetic field atmosphere of said use place;
    generating a rated magnetic field in said MRI superconducting magnet thus shimmed, under an environment in which said magnetic field atmosphere of said use place is realized; and
    installing said MRI superconducting magnet in said use place after the step of generating said rated magnetic field, wherein:
    a magnetic member is disposed around said MRI superconducting magnet to realize said magnetic field atmosphere of said use place, and
    said magnetic member exerts, to said MRI superconducting magnet generating said rated magnetic field, electromagnetic force equivalent to electromagnetic force exerted to said MRI superconducting magnet generating said rated magnetic field in said magnetic field atmosphere of said use place.

2. A method for adjusting an MRI superconducting magnet before installation thereof in a use place, comprising the steps of:
    shimming said MRI superconducting magnet in consideration of a magnetic field atmosphere of said use place;
    generating a rated magnetic field in said MRI superconducting magnet thus shimmed, under an environment in which said magnetic field atmosphere of said use place is realized; and
    installing said MRI superconducting magnet in said use place after the step of generating said rated magnetic field,
    wherein in the step of generating said rated magnetic field, said rated magnetic field is repeatedly generated until no quench takes place in said MRI superconducting magnet.

* * * * *